United States Patent
Nicollini et al.

(10) Patent No.: US 6,529,068 B1
(45) Date of Patent: *Mar. 4, 2003

(54) AREA-EFFICIENT RECONSTRUCTION FILTERS, PARTICULARLY FOR CURRENT-DRIVEN D/A CONVERTERS

(75) Inventors: Germano Nicollini, Piacenza (IT); Pierangelo Confalonieri, Caponago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 09/293,556

(22) Filed: Apr. 15, 1999

Related U.S. Application Data

(63) Continuation-in-part of application No. 09/129,450, filed on Aug. 4, 1998, now Pat. No. 6,201,438.

(30) Foreign Application Priority Data

Aug. 29, 1997 (EP) .............................................. 97830429

(51) Int. Cl.$^7$ ................................................. H03K 5/00
(52) U.S. Cl. ....................................... 327/552; 327/558
(58) Field of Search ................................ 327/552, 553, 327/558; 341/144

(56) References Cited

U.S. PATENT DOCUMENTS 4,536,760 A * 8/1985 Navarro et al. ............. 340/722
5,412,335 A   5/1995 Jackson et al. ............. 327/552

OTHER PUBLICATIONS

European Search Report from European Patent Application 97830429.3, filed Aug. 29, 1997.
J. Whitmore: "Digital–To–Analog Converter Controls Active Filter" Electronics, DE 1984 A 1985: Electronics Week., vol. 48, No. 2, Jan. 23, 1975, New York US, p. 86.

* cited by examiner

*Primary Examiner*—Dinh T. Le
(74) *Attorney, Agent, or Firm*—Wolf, Greenfield & Sacks, P.C.; James H. Morris

(57) ABSTRACT

An area-efficient reconstruction filter removes undesirable sample images produced by current-driven digital-to-analog converters. The reconstruction filter includes: an input node for receiving the input current signal; an operational amplifier having first and second inputs and an output at which the output voltage signal is produced; a first resistor coupled between the output of the operational amplifier and the input node; a second resistor coupled to the first input of the operational amplifier; and a third resistor coupled between the input node and the second resistor. The reconstruction filter may also include a fourth resistor coupled between the input node and a reference voltage.

30 Claims, 3 Drawing Sheets

US 6,529,068 B1

AREA-EFFICIENT RECONSTRUCTION FILTERS, PARTICULARLY FOR CURRENT-DRIVEN D/A CONVERTERS

CROSS-REFERENCE TO RELATED APPLICATIONS

This is a continuation-in-part of application Ser. No. 09/129,450 filed Aug. 4, 1998, U.S. Pat. No. 6,201,438.

TECHNICAL FIELD

The present invention relates to area-efficient reconstruction filters, particularly for current-driven digital-to-analog converters (DAC).

BACKGROUND OF THE INVENTION

Digital-to-analog converters are conventionally used very frequently in integrated circuits.

Since these converters are sampled-data circuits, in addition to generating the intended analog signal in the correct frequency range or base band, they also produce in output an undesirable duplicate image of the signal, generally designated as "imaging", as shown in FIG. 1, which plots the output of the DAC as a function of the frequency f.

The chart shows that in addition to the output signal, designated by S (where B is the base band), there is also a duplicate image of the signal S which is centered around the sampling frequency $f_S$ of the DAC.

In order to eliminate this duplicate image, a continuous-time low-pass reconstruction filter is usually introduced and placed downstream of the DAC, as shown in FIG. 2.

In this Figure, the reference numeral 1 designates an N-bit DAC, where $b_0, b_1, \ldots, b_a-1$ are the input bits of the DAC and $V_{DAC}$ and $I_{DAC}$ are, respectively, the output voltage and the output current of the DAC. The reference numeral 2 instead designates a continuous-time low-pass reconstruction filter arranged downstream of the DAC 1 and $V_0$ is the output voltage.

The reconstruction filter 2 must provide high attenuation for frequencies close to the sampling frequency $f_S$ of the DAC, but at the same time it must be efficient in terms of area occupation if the DAC is to be used in an integrated circuit, where of course the requirement of minimum area occupation is one of the most important factors.

It is known to those skilled in the art that these are two mutually contrasting requirements.

It is therefore necessary to achieve a compromise, shown in FIGS. 3a and 3b. The filters shown in these figures are second-order low-pass filters. The solution shown in FIG. 3b, however, is the one that is practically mandatory when working with supply voltages of less than 3V The solution of FIG. 3b is rather area efficient when the input signal is a voltage, but it would be highly insufficient when the input signal must be a current, as shown in FIG. 3c by applying only the Norton equivalent to the input of FIG. 3b.

A numeric example is now described to clarity the above explanation.

Assume that a DAC has been devised which has a full-scale voltage output $V_{iPS}=0.5$ V and that a full-scale voltage $V_{GPS}=0.5$ V from the reconstruction filter is required as output. Assume also that a cutoff frequency of approximately 270 kHz is chosen for the filter.

The values of the components of FIG. 3b will be as follows:

$R_1=R_2=R_3=50$ kohm $C_1=25.2$ pF $C_2=5.6$ pF

Assume also that one intends to use a DAC with a full-scale current output $I_{DACFS}=160$ μA and that one seeks a full-scale output voltage $V_{CFS}=0.5$ V from the reconstruction filter with a frequency response that is identical to that of the filter used previously with the voltage-output DAC.

Since one must have $R_3 I_{DACFS}=V_{OFS}$, then $R_3=3.125$ kohm and therefore $R_1=R_2=R_3=3.125$ kohm.

Therefore, in order to have the same frequency response as the preceding filter, the values of $C_1$ and $C_2$ must be 403.2 pF and 89.6 pF respectively.

Accordingly, the area occupied on the silicon in order to integrate the values of these components is approximately sixteen times greater than the area occupied to integrate the components of FIG. 3b, due to the relatively low specific capacitance that can be provided in integrated circuits.

Therefore, the reconstruction filter, in the case of a current input (and therefore of a current output of the DAC), is very wasteful from the point of view of the area occupied on the silicon wafer.

SUMMARY OF THE INVENTION

An aim of the present invention is to provide an area-efficient reconstruction filter, particularly for current-driven digital-to-analog converters.

Within the scope of this aim, an object of the present invention is to provide a reconstruction filter for current-driven digital-to-analog converters which is optimized in view of its integration in an integrated circuit.

Another object of the present invention is to provide a reconstruction filter for current-driven digital-to-analog converters in which the reconstruction filter with current input has an area occupation at least as good as the corresponding reconstruction filter with voltage input.

Another object of the present invention is to provide a reconstruction filter with current input having the same transfer function as a similar reconstruction filter with voltage input.

Another object of the present invention is to provide a reconstruction filter that is highly reliable, relatively easy to produce, and cost-competitive.

This aim, these objects and others which will become apparent hereinafter are achieved in one embodiment by an area-efficient reconstruction filter, particularly for current-driven digital-to-analog converters, including: an input node for receiving the input current signal; an operational amplifier having first and second inputs and an output at which the output voltage signal is produced; a first resistor coupled between the output of the operational amplifier and the input node; a second resistor connected to the first input of the operational amplifier; and a third resistor connected between the input node and the second resistor. The reconstruction filter may also include a fourth resistor coupled between the input node and a reference voltage.

BRIEF DESCRIPTION OF THE DRAWINGS

Further characteristics and advantages of the present invention will become apparent from the description of preferred but not exclusive embodiments of a reconstruction filter according to the invention, illustrated only by way of non-limitative example in the s accompanying drawings.

DETAILED DESCRIPTION

Figure 1:
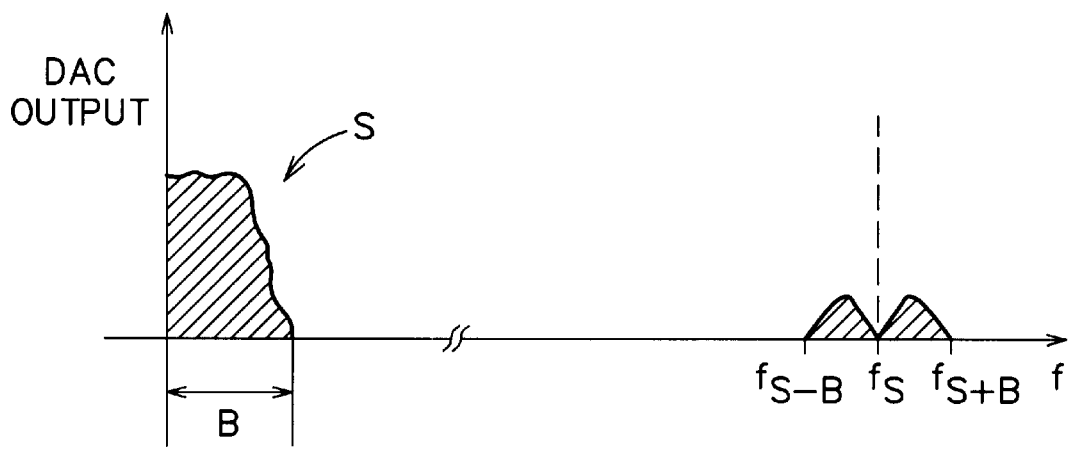
FIG. 1 is a chart that plots the signal in output from a DAC.
Figure 2:
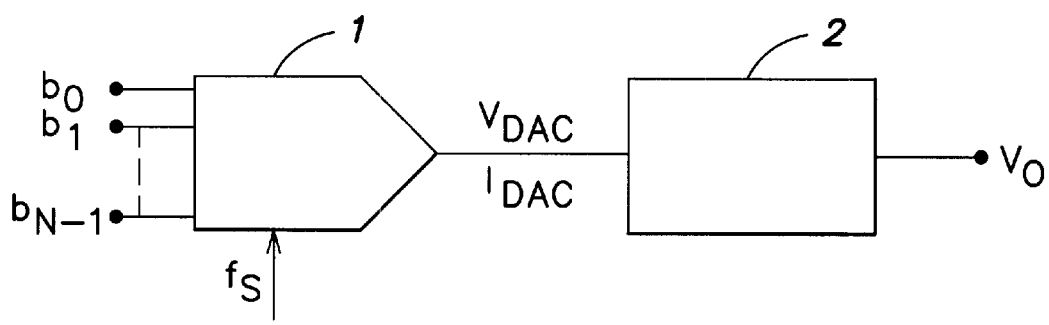
FIG. 2 is a block diagram of a DAC circuit having a DAC stage and a reconstruction filter arranged downstream thereof.

In the various Figures, identical reference numeral and letters designate identical elements.

Figure 3A:
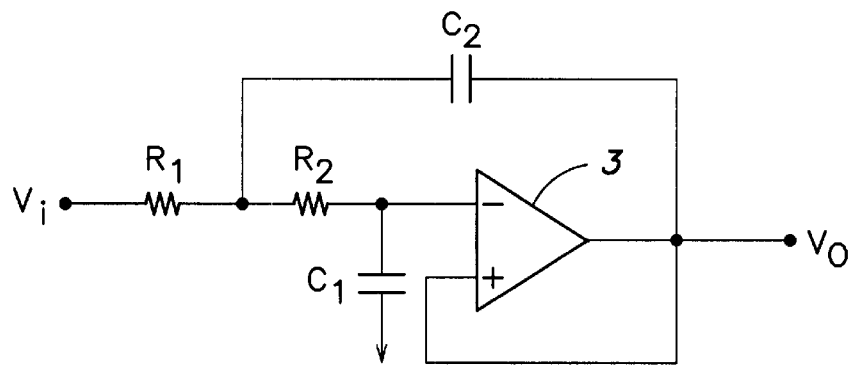
FIGS. 3a and 3b are circuit diagrams of conventional low-pass, continuous-time, second-order, voltage-input reconstruction filters used downstream of a DAC stage.
Figure 3B:
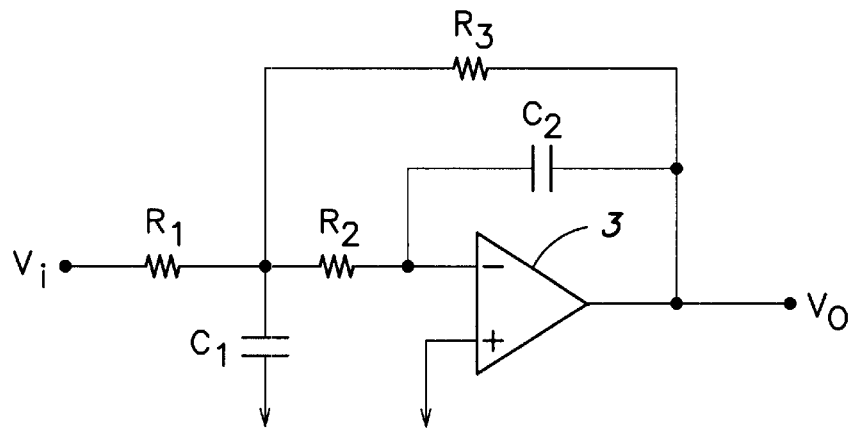
Figure 3C:
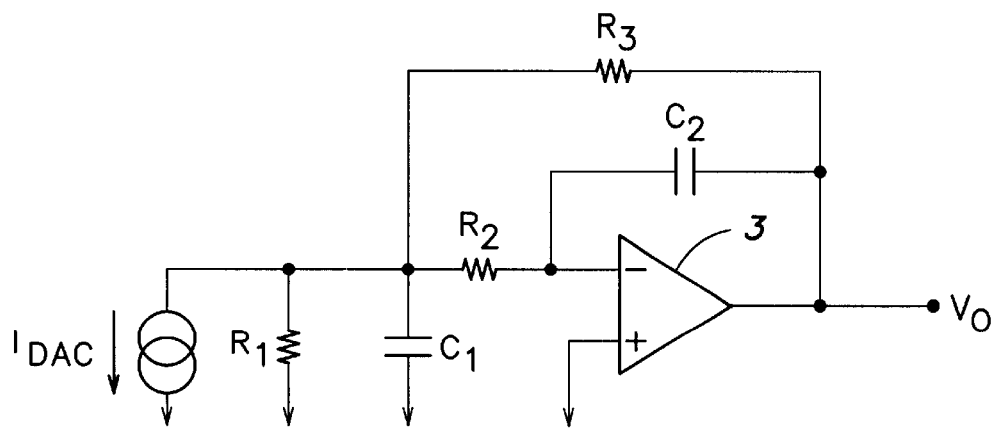
FIG. 3c is a circuit diagram of a conventional low-pass, continuous-time, second-order current-input reconstruction filter, conceptually similar to the filter shown in FIG. 3b.

The transfer functions of the reconstruction filters of FIGS. 3a–3c are respectively the following.

For the filter of FIG. 3a:

$$V_0(s)/V_i(s)=1/[1+sC_1(R_1+R_2)+s^2C_1C_2R_1R_2].$$

For the filter of FIG. 3b:

$$V_0(s)/V_i(s)=(R_3/R_1)/[1+sC_2(R_2+R_3+R_2R_3/R_1)+s^2C_1C_2R_2R_3].$$

And finally, for the filter of FIG. 3c:

$$V_0(s)/I_{DAC}(s)=R_3/[1+sC_2(R_2+R_3+R_2R_3/R_1)+s^2C_1C_2R_2R_3];$$

where $R_1I_{DAC}=V_i(s)$.

Figure 4:
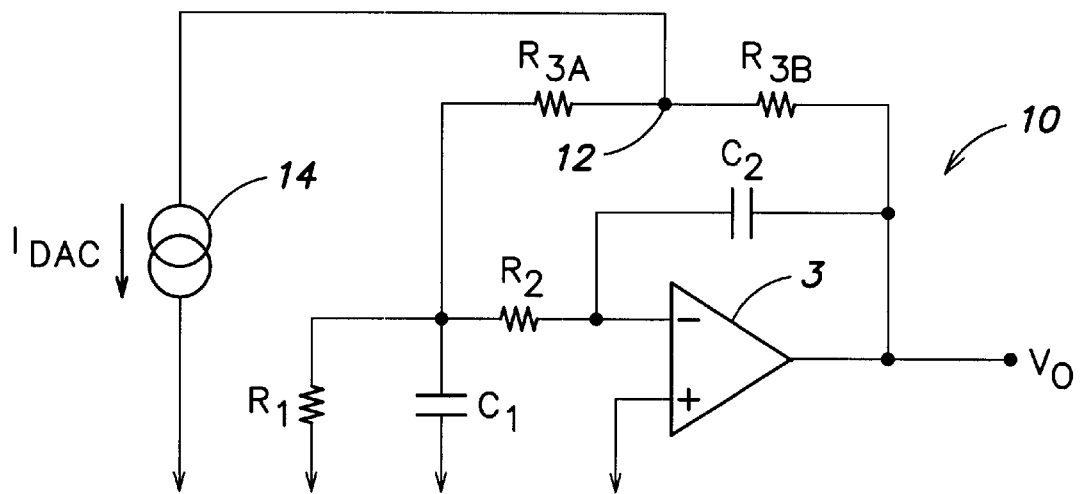
FIG. 4 is a circuit diagram of a low-pass, continuous-time, second-order current-input reconstruction filter according to a first embodiment of the present invention.

A reconstruction filter 10 according to a first embodiment of the invention is shown in FIG. 4. The reconstruction filter 10 is of the low-pass, second-order, continuous-time type and comprises an operational amplifier 3 that is advantageously provided in an inverting configuration, as in FIGS. 3b–3c. The operational amplifier 3 has a non-inverting input that is connected to the ground.

The reconstruction filter 10 includes a first resistor $R_1$ parallel-connected to a first capacitor $C_1$. A second resistor $R_2$ has a first terminal connected to a common node between the first resistor and the first capacitor and a second terminal connected to the inverting input of the operational amplifier 3.

A second capacitor $C_2$ is feedback-connected between the output $V_0$ of the operational amplifier 3 and the inverting input. Two resistors $R_{3A}$ and $R_{3B}$ are connected in series with each other between the output of the operational amplifier and the first terminal of the second resistor $R_2$. An input node 12 is coupled to a DAC stage 14 that feeds a current $I_{DAC}$ to the input node.

A comparison between the reconstruction filter 10 shown in FIG. 4 and the circuit of FIG. 3c shows the resistor $R_3$ of FIG. 3c has been divided into the series-connected resistors $R_{3A}$ and $R_{3B}$ (third and fourth resistors, respectively), so that the sum of these last two resistors arranged in series is equal in value to the resistor $R_3$. In addition, the current $I_{DAC}$ enters directly at input node 12 between the two resistors $R_{3A}$ and $R_{3B}$ rather than at the junction between the first capacitor and the first, second, and third resistors $R_1,R_2,R_3$ as in the circuit of FIG. 3c.

Calculation of the transfer function of the reconstruction filter 10 shows that in the case of a reconstruction filter with a current input ($I_{DAC}$), the transfer function of the filter does not change and is always equal to that of the filter of FIG. 3b. Moreover, the area occupation of the reconstruction filter 10 is considerably smaller than that of the filter of FIG. 3c (it is in fact similar to that of the filter of FIG. 3b).

The transfer function for the reconstruction filter 10 is:

$$V_0(s)/I_{DAC}(s)=R_{3B}/[1+sC_2(R_2+R_{3A}+R_{3B}+R_2(R_{3A}+R_{3B})/R_1)+s^2C_1C_2R_2(R_{3A}+R_{3B}];$$

where $R_{3A}+R_{3B}=R_3$ and $R_{3B}I_{DAC}=V_{OFS}$.

In practice it has been observed that the reconstruction filter 10 fully achieves the intended aim and objects discussed above, since it optimizes the area occupied by the filter with a current input, in a manner similar to what occurs with a voltage-input reconstruction filter, thus allowing effective use thereof in an integrated circuit.

Figure 5:
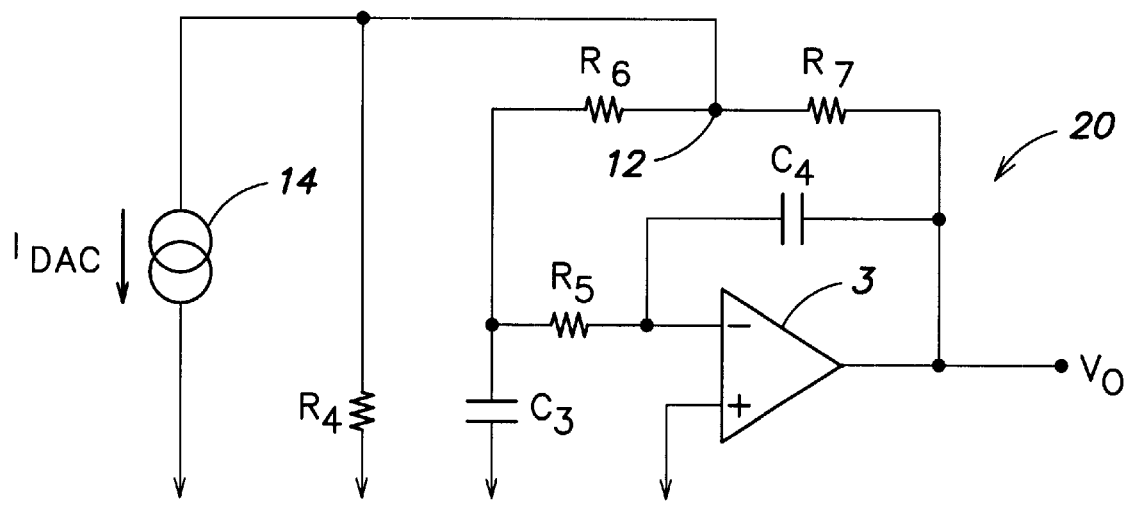
FIG. 5 is a circuit diagram of a reconstruction filter according to a second embodiment of the present invention.

A reconstruction filter 20 according to a second embodiment of the invention is shown in FIG. 5. The reconstruction filter 20 differs from the reconstruction filter 10 of FIG. 4 in that rather than the first resistor $R_1$ being in parallel with the first capacitor $C_1$, the reconstruction filter 20 includes a first resistor $R_4$ coupled directly to the input node 12. In other words, the first resistor $R_4$ of the reconstruction filter 20 is placed in parallel with the DAC stage 14, The resistors $R_5$, $R_6$, and $R_7$ are positioned like the resistors $R_2$, $R_{3A}$, and $R_{3B}$, respectively of FIG. 4, and the capacitors $C_3$ and $C_4$ are positioned like the capacitors $C_1$ and $C_2$, respectively of FIG. 4.

In order to give the reconstruction filter 20 of FIG. 5 the same transfer function and frequency response as the reconstruction filter 10 of FIG. 4, the values of the resistors and capacitors of the reconstruction filter 20 should be resized compared to those of the reconstruction filter 10. The transfer function of the reconstruction filter 20 is:

$$\frac{V_0(s)}{I_{DAC}(s)} = \frac{R_7}{1 + sC_4\left[R_5\left(1+\frac{R_7}{R_4}\right)+R_6+R_7+\frac{R_6R_7}{R_4}\right]+s^2C_3C_4R_5\left(R_6+R_7+\frac{R_6R_7}{R_4}\right)}.$$

Equalizing the transfer functions of the reconstruction filters 10, 20 of FIGS. 4 and 5 and resolving the resulting system one obtains:

$$R_5 = \frac{R_2}{k} \quad R_7 = R_{3B}$$

$$R_4 = \frac{R_{3B}}{k\left[\left(2-\frac{1}{k}\right)+\frac{R_{3A}+R_{3B}}{R_2}(1-k)\right]}$$

$$R_6 = \frac{k(R_{3A}+R_{3B})-R_{3B}}{k\left[2+\frac{R_{3A}+R_{3B}}{R_2}(1-k)\right]}.$$

By opportunely choosing k, it can be demonstrated that the sum of the resistance values so obtained for the reconstruction filter 20 ($R_4+R_5+R_6+R_7$) is much less than that of the reconstruction filter 10 ($R_1+R_2+R_{3A}+R_{3B}$). For example, if a cut-off frequency of 270 KHz is desired for the reconstruction filters 10, 20, with $I_{DACFS}=160\,\mu A$ and $V_{aFS}=0.5$ V, the reconstruction filter 10 of FIG. 4 would require:

$R_1=R_2=50$ KΩ $R_{3A}=46.875$ KΩ $R_{3B}=3.125$ KΩ $C_1=25.2$ pF $C_2=5.6$ pF.

In contrast, the reconstruction filter 20 of FIG. 5 would require:

$R_4=R_7=3.125$ KΩ $R_5=50$ KΩ $R_6=23.4375$ KΩ $C_1=25.2$ pF $C_2=5.6$ pF.

As a result, the total resistance for the reconstruction filter is 150 KΩ, while the total resistance for the reconstruction filter 20 is only 78 KΩ. Such smaller resistance values results in a silicon area savings of about 50% for the resistors of the reconstruction filter 20 compared to the ones of the reconstruction filter 10 and the prior art voltage-input reconstruction filter of FIG. 3b.

The reconstruction filters 10, 20 discussed above are susceptible to numerous modifications and variations, all of which are within the scope of the inventive concept. All the details may also be replaced with other technically equivalent elements.

In practice, the materials employed, so long as they are compatible with the specific use, as well as the dimensions, may be any according to requirements and to the state of the art.

From the foregoing it will be appreciated that, although specific embodiments of the invention have been described herein for purposes of illustration, various modifications may be made without deviating from the spirit and scope of the invention. Accordingly, the invention is not limited except as by the appended claims and equivalents thereto.

What is claimed is:

1. A reconstruction filter for producing an output voltage signal based on an input current signal, comprising:
   an input node for receiving the input current signal;
   an operational amplifier having first and second inputs and an output at which the output voltage signal is produced;
   a first resistor coupled between the output of the operational amplifier and the input node;
   a common node;
   a second resistor having a first end connected to the common node and a second end coupled to the first input of the operational amplifier;
   a third resistor coupled between the input node and a voltage reference;
   a fourth resistor coupled between the input node and the common node, and
   a first capacitor coupled between the second end of the common node and the voltage reference.

2. The reconstruction filter of claim 1, further comprising a second capacitor coupled between the first input node and output node of the operational amplifier.

3. The reconstruction filter of claim 1 wherein the second input of the operational amplifier is coupled to a reference voltage.

4. A digital to analog converter (DAC) circuit for producing an analog output voltage signal based on an input digital signal, comprising:
   a DAC stage structured to convert the input digital signal into an analog current signal;
   an operational amplifier having first and second inputs and an output at which the analog output voltage is produced;
   a first resistor coupled between the output of the operational amplifier and the DAC stage;
   a common node;
   a second resistor having a first end coupled to the first input of the operational amplifier and a second end coupled to the common node;
   a third resistor coupled between the DAC stage and the common node; and
   a capacitor coupled from the common node to a reference voltage.

5. The DAC circuit of claim 4, further comprising a fourth resistor coupled between the DAC stage and a reference voltage.

6. The DAC circuit of claim 4, further comprising another capacitor coupled between the first input node and output node of the operational amplifier.

7. The DAC circuit of claim 4 wherein the second input of the operational amplifier is coupled to a reference voltage.

8. The DAC circuit of claim 4 wherein the second input of the operational amplifier is coupled to a reference voltage and the DAC circuit further comprises a fourth resistor coupled between the input node and the reference voltage.

9. The DAC circuit of claim 8, further comprising:
   a first capacitor coupled from the common node to the reference voltage; and
   a second capacitor coupled between the first input and output nodes of the operational amplifier.

10. A reconstruction filter for producing an output voltage signal based on an input current signal, comprising:
    an input node for receiving the input current signal;
    an operational amplifier having first and second inputs and an output at which the output voltage signal is produced;
    a first resistor coupled between the output of the operational amplifier and the input node;
    a common node;
    a second resistor having a first end connected to the first input of the operational amplifier and a second end connected to the common node;
    a third resistor coupled between the input node and the common node; and
    a first capacitor coupled from the common node to a reference voltage.

11. The reconstruction filter of claim 10, further comprising a fourth resistor coupled between said input node and a reference voltage.

12. The reconstruction filter of claim 10 further including a second capacitor connected between the first input and the output of the operational amplifier.

13. The reconstruction filter of claim 11 further including a second capacitor connected between the first input and the output of the operational amplifier.

14. A reconstruction filter for producing an output voltage signal based on an input current signal, wherein said filter includes, an operational amplifier having first and second inputs and an output at which the output voltage signal is produced, and a resistor having a first end coupled to the first input of the operational amplifier and a second end coupled to a common node, the improvement comprising:
    a resistor network including a pair of series-connected resistors coupled between the common node and the output of the operational amplifier;
    the connection between said series-connected resistors defining an input node to which the input current signal is applied; and
    a capacitor coupled from the common node to a reference voltage.

15. The reconstruction filter of claim 14 further comprising another resistor coupled from the common node and a reference voltage.

16. The reconstruction filter of claim 14 further comprising a fourth resistor coupled from said input node to a reference voltage.

17. A reconstruction filter for producing an output voltage signal based on an input current signal, wherein said filter includes, an operational amplifier having first and second inputs and an output at which the output voltage signal is produced, and a resistor having a first end coupled to the first input of the operational amplifier and a second end coupled to a common node, the improvement comprising:
- a resistor network means including a pair of series-connected resistors coupled between the common node and the output of the operational amplifier;
- the connection between said series-connected resistors defining an input node;
- means coupling said input current signal to said input node; and
- a capacitor coupled from the common node to a reference voltage.

18. The reconstruction filter of claim 17 further comprising another resistor coupled from the common node to a reference voltage.

19. The reconstruction filter of claim 17 further including another resistor coupled from said input node to a reference voltage.

20. A reconstruction filter for producing an output voltage signal based on an input current signal, comprising:
- an input node for receiving the input current signal;
- an amplifier having first and second inputs and an output at which the output voltage signal is provided;
- a first resistor coupled between the output of the amplifier and the input node;
- a common node;
- a second resistor coupled between said common node and the first input of the amplifier;
- a third resistor coupled in series with said first resistor coupled between said input node and the same common node to which the second resistor is coupled; and
- a capacitor coupled from the common node to a reference voltage.

21. The reconstruction filter of claim 20, wherein the second input of the operational amplifier is coupled to a reference voltage and the reconstruction filter further comprises a fourth resistor coupled between the input node and the reference voltage.

22. The reconstruction filter of claim 21, further comprising:
- a first capacitor coupled from the second resistor to the reference voltage; and
- a second capacitor coupled between the first input and output nodes of the operational amplifier.

23. The reconstruction filter of claim 20, further comprising a fourth resistor coupled between the input node and a reference voltage.

24. The reconstruction filter of claim 23, further comprising a second capacitor connected between the first input and the output of the amplifier.

25. The reconstruction filter of claim 24, wherein the second input of the amplifier is coupled to a reference voltage.

26. The reconstruction filter of claim 25, wherein the amplifier is an amplifier.

27. The reconstruction filter of claim 20, further comprising a fourth resistor coupled between said common node and a reference voltage.

28. The reconstruction filter of claim 27, further comprising a second capacitor connected between the first input and the output of the amplifier.

29. The reconstruction filter of claim 28, wherein the second input of the coupled to a reference voltage.

30. The reconstruction filter of claim 29, wherein the amplifier is an amplifier.

* * * * *

UNITED STATES PATENT AND TRADEMARK OFFICE
CERTIFICATE OF CORRECTION

PATENT NO. : 6,529,068 B1
DATED : March 4, 2003
INVENTOR(S) : Germano Nicollini and Pierangelo Confalonieri It is certified that error appears in the above-identified patent and that said Letters Patent is hereby corrected as shown below:

Column 4,
Line 57, should read -- struction filters 10, 20, with $I_{DACFS}$=160 µA and $V_{OFS}$=0.5 V --

Signed and Sealed this

Twenty-fourth Day of June, 2003

JAMES E. ROGAN
*Director of the United States Patent and Trademark Office*